United States Patent [19]

Tanaka et al.

[11] Patent Number: 4,970,435

[45] Date of Patent: Nov. 13, 1990

[54] PLASMA PROCESSING APPARATUS

[75] Inventors: Susumu Tanaka, Hachioji; Yuki Hamada, Yokohama; Yasushi Sasaki, Atsugi; Yutaka Shimada, Sagamihara; Susumu Fukuoka, Shiroyama, all of Japan

[73] Assignee: Tel Sagami Limited, Kanagawa, Japan

[21] Appl. No.: 281,349

[22] Filed: Dec. 8, 1988

[30] Foreign Application Priority Data

Dec. 9, 1987 [JP] Japan .................................. 62-311200
May 25, 1988 [JP] Japan .................................. 63-127567

[51] Int. Cl.$^5$ .......................... H01J 7/24; H01J 17/26; H05B 31/26; C23C 14/00
[52] U.S. Cl. .............................. 315/111.21; 118/50.1; 118/715; 313/231.31
[58] Field of Search ............... 333/99 PL; 315/111.21; 313/231.31; 118/715, 723, 50.1; 156/643; 427/38, 47

[56] References Cited

U.S. PATENT DOCUMENTS

| 3,828,722 | 8/1974 | Reuter et al. | 118/48 |
| 4,201,579 | 5/1980 | Robinson et al. | 315/111.21 |
| 4,401,054 | 8/1983 | Matsuo et al. | 118/50.1 |
| 4,423,303 | 12/1983 | Hirose et al. | 315/111.21 |
| 4,611,121 | 9/1986 | Miyamura et al. | 315/111.41 |

FOREIGN PATENT DOCUMENTS

| 284436 | 9/1988 | European Pat. Off. . | |
| 58-24711 | 5/1983 | Japan . | |
| 60-24034 | 2/1985 | Japan . | |
| 60-8622 | 3/1985 | Japan . | |
| 60-201641 | 10/1985 | Japan . | |
| 61-191015 | 8/1986 | Japan . | |
| 61-157325 | 9/1986 | Japan . | |
| 58630 | 3/1987 | Japan | 313/231.31 |
| 210621 | 9/1987 | Japan | 313/231.31 |
| 60530 | 3/1988 | Japan | 313/231.31 |
| 73624 | 4/1988 | Japan | 313/231.31 |
| 8810506 | 12/1988 | PCT Int'l Appl. | 315/111.21 |

OTHER PUBLICATIONS

Japanese Journal of Applied Physics, vol. 16, No. 11, Nov. 1977, pp. 1979–1984; K. Suzuki, et al.
Japanese Journal of Applied Physics, vol. 19, No. 5, May 1980, pp. 839–843; Y. Sakamoto, et al.
Japanese Journal of Applied Physics, vol. 21, No. 1, Jan. 1982, pp. L4–L6; S. Matsuo, et al.
Japanese Journal of Applied Physics, vol. 22, No. 4, Apr. 1983, pp. L210–L212; S. Matsuo, et al.
Proc. International Engineering Congress-ISIAT'83 & IPAT'83, Kvoto (1983); K. Asakawa, et al. pp. 759–764.

*Primary Examiner*—Eugene R. Laroche
*Assistant Examiner*—Michael B. Shingleton
*Attorney, Agent, or Firm*—Oblon, Spivak, McClelland, Maier & Neustadt

[57] ABSTRACT

In a plasma processing apparatus of this invention, a reaction chamber opposed to a plasma generating chmaber is entirely opened at its one side surface opposing the obect to be processed, and an interval between the one side surface and the other side surface is set to be an integer multiple of a ½ wavelength of the microwave. A microwave oscillated by a microwave oscillator and supplied to a vacuum vessel can be converted into a plasma energy with high conversion efficiency, thereby minimizing a reflected wave.

8 Claims, 12 Drawing Sheets

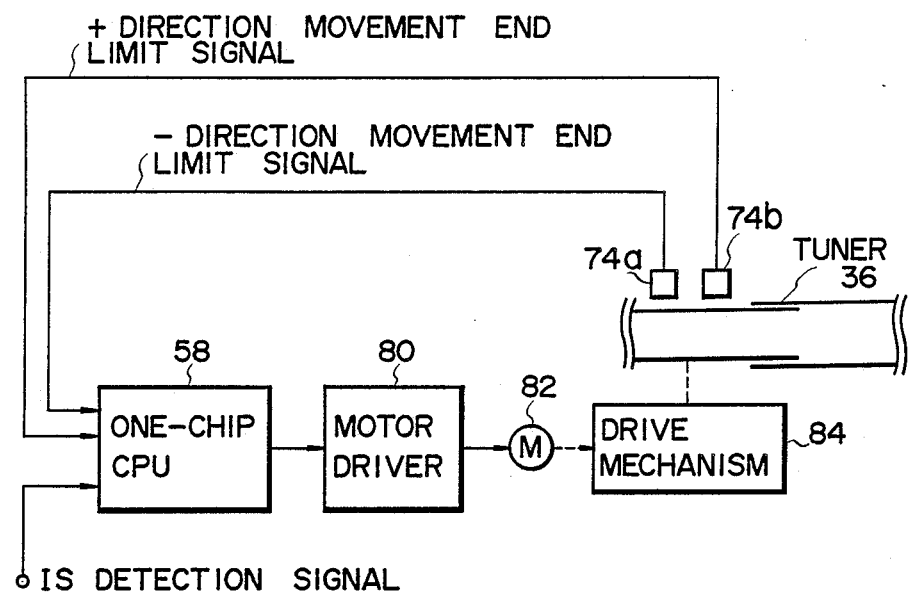
F I G. 9
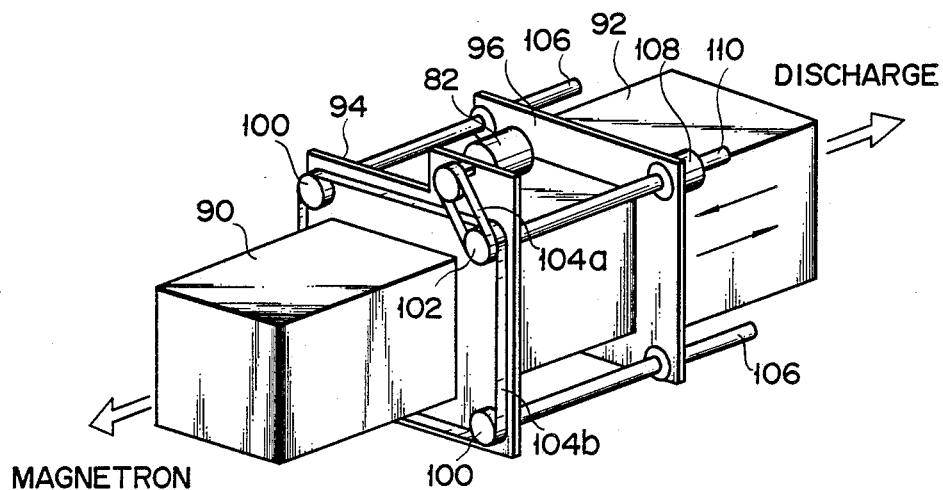
F I G. 11

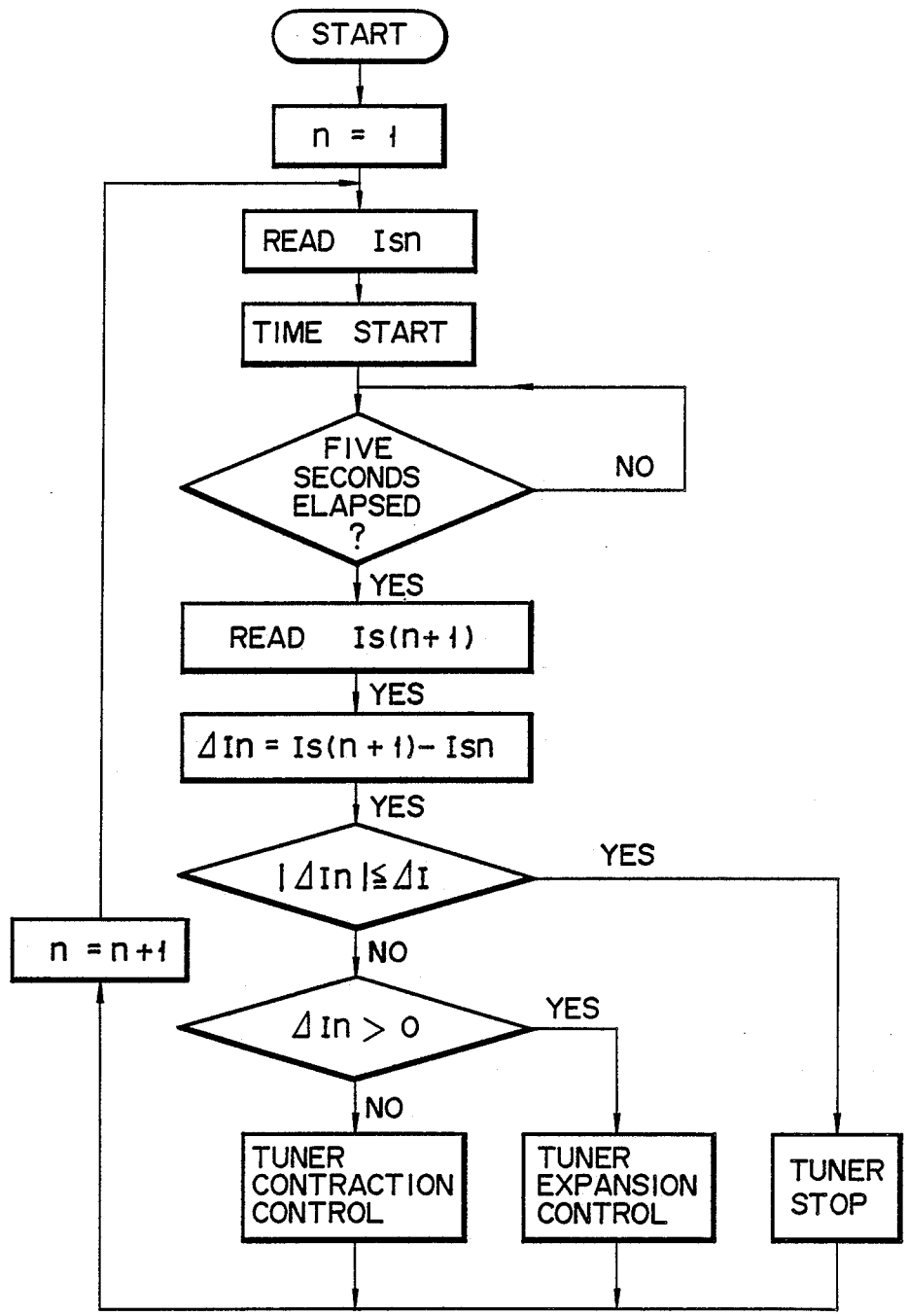
F I G. 10

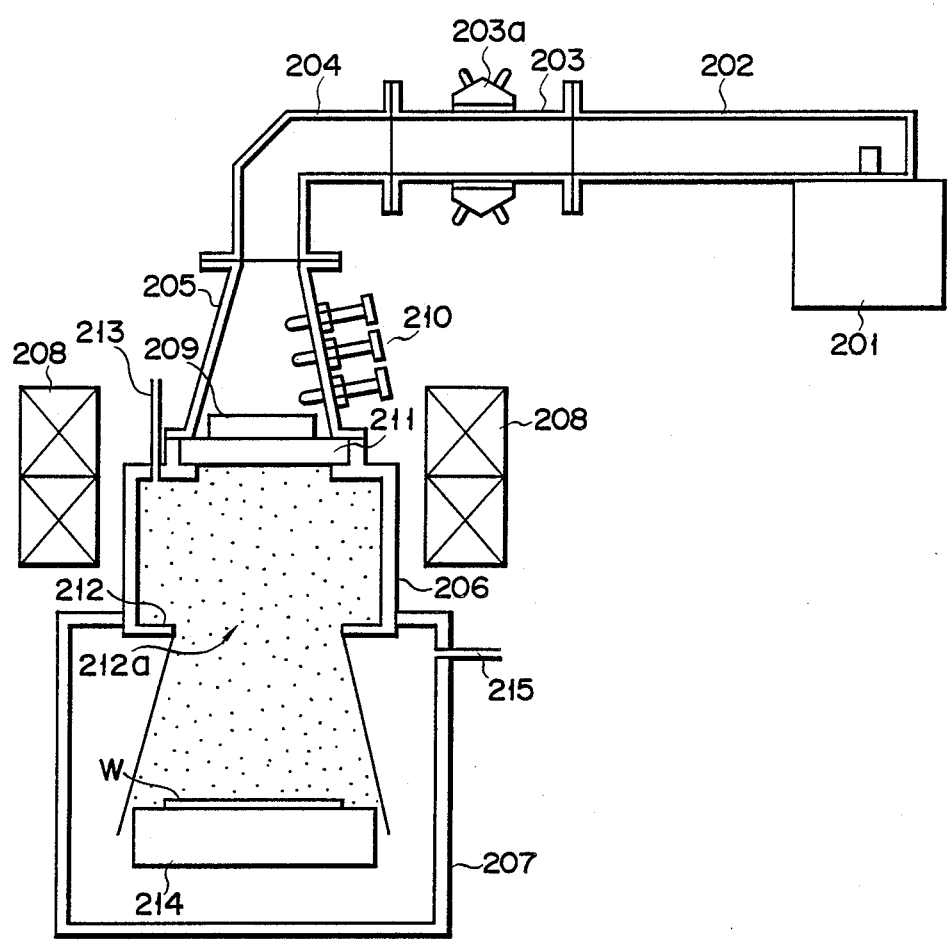
F I G. 12

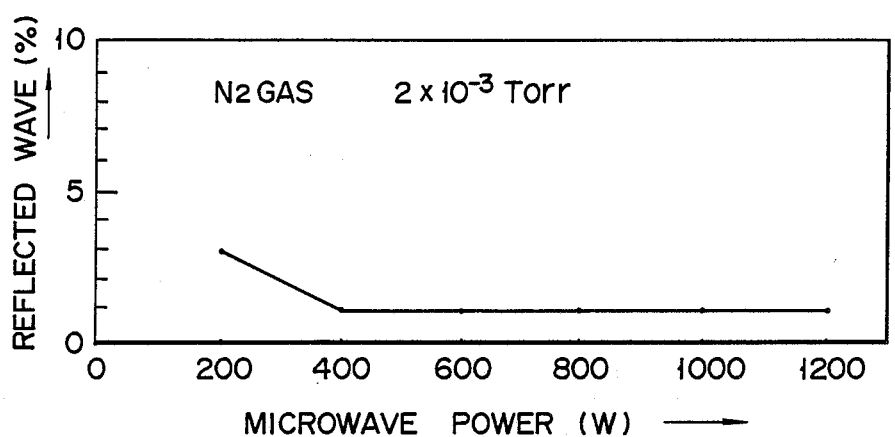
F I G. 13
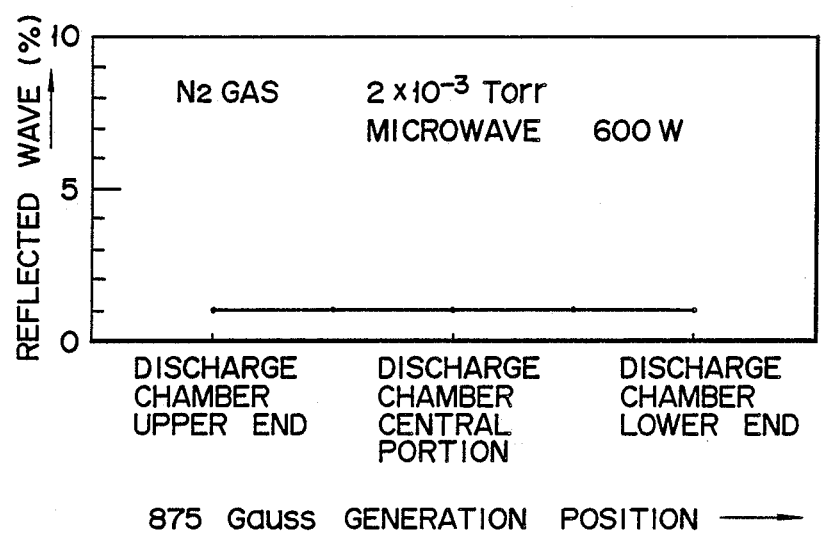
F I G. 14

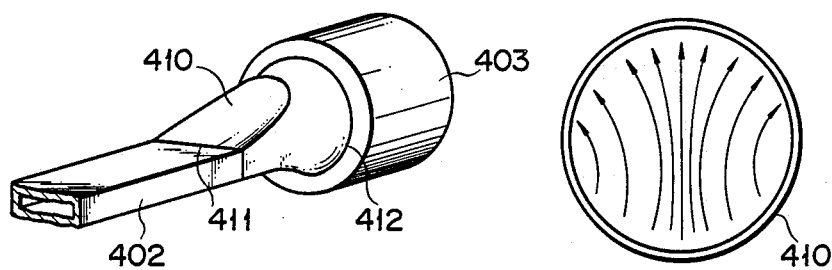
F I G. 17    F I G. 18
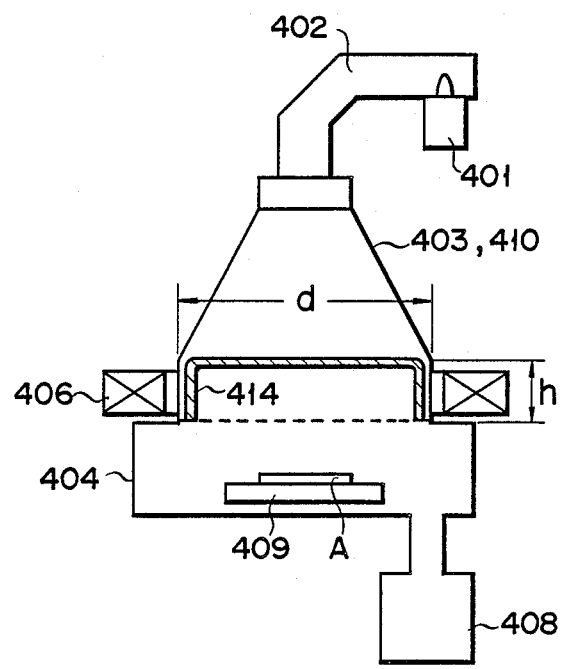
F I G. 19

PLASMA PROCESSING APPARATUS

BACKGROUND OF THE INVENTION

1. Field of the Invention

The present invention relates to a plasma processing apparatus for generating a plasma by an electron cyclotron resonance (ECR) phenomenon and, more particularly, to a plasma processing apparatus suitably used as a semiconductor manufacturing apparatus such as an ECR etching apparatus or an ECR-CVD (ECR-Chemical Vapor Deposition) apparatus.

2. Description of the Related Art

Japanese Journal of Applied Physics Vol. 16, No. 11, Nov. 1977, pp. 1979–1984 (reference I), discloses a microwave plasma etching technique, and concludes as follows. In this technique, these fine patterns of 1 $\mu$m size have been etched up to 1 $\mu$m in depth without undercutting. This fine pattern etching has been difficult with conventional etching technique, and has been made possible by creating a plasma of high density at low pressure by microwave discharge. Etching by this technique is thought to be carried out by chemical reactions. Therefore, it is expected that the damage to the substrate is negligibly small and that the selectivity of etched materials is high. For instance, only Si is etched with a plasma of ($CF_4+O_2$) mixture, leaving Al masks intact. The discharge area is shielded with a quartz tube to decrease the substrate contamination. Considering these advanced characteristics, this etching technique is thought to be suitable for semiconductor device processing. It is expected to make possible the fabrication of highly packing density integrated semiconductor devices.

Japanese Journal of Applied Physics Vol. 19, No. 5, May 1980, pp. 839–843 (reference II) discloses a technique on reduction of metal oxides by ECR plasma of hydrogen (a model study on discharge cleaning). In this technique, thick layers ($\sim 0.1$ $\mu$m) of oxides of Cu, Ni, Fe, Mo and Ti which have widely different binding energies (metal-oxygen) are reduced by an ECR plasma. Roughly speaking, the reduction rate decreases with an increase in binding energy. The reduction efficiency for $Cu_2O$ is 0.8 initially and 0.4 on average. Concerning the other oxides, $10^{-3} < \eta < 10^{-2}$.

Japanese Journal of Applied Physics Vol. 21, No. 1, Jan. 1982, pp. 14–16 (reference III) discloses a technique on reactive ion beam etching using a broad beam ECR in source. A broad-beam ion source using microwave electron cyclotron resonance (ECR) discharge has been newly developed for reactive ion beam etching, ensuring high reliability in operation. Ion extration characteristics comparable to those of a Kaufman-type ion source are stably obtained for various reactive gases. The etching characteristics of various materials such as $SiO_2$ and Al were investigated by introducing gases such as $C_4F_8$ and $SiCl_4$ into the ion source. Reactive ion beam etching using the broad-beam ECR ion source is very useful for high-accuracy pattern formation.

Japanese Journal of Applied Physics Vol. 22, No. 4, April 1983, pp. L210–L212 (reference IV) discloses a technique on low temperature chemical vapor deposition method utilizing an ECR plasma. The plasma deposition apparatus used in this technique can realize a deposition of dense and high quality thin films, such as $Si_3N_4$ and $SiO_2$, without the need for substrate heating. The deposition reactions are enhanced by using a microwave ECR plasma excitation at low gas pressures of $10^{-4}$ Torr, and a plasma extraction by a divergent magnetic field method, which bring about highly activated plasma and ion acceleration with moderate energies of 10 to 20 eV, respectively. The $Si_3N_4$ and $SiO_2$ films deposited are comparable to those prepared respectively by high temperature CVD and thermal oxidation, in evaluations such as by buffered HF solution etch rate measurement. The ECR plasma deposition method can be applied not only to silicon LSI, but also to compound semiconductor device fabrication processes.

Proc. Int'l Ion Engineering Congress - ISIAT '83 & IPAT '83, Kyoto (1983) (reference V) discloses a technique on a new reactive ion beam etching system for clean-surface-oriented dry etching technology. A new reactive ion beam etching system for investigating the elementary process of the clean-surface-oriented III-V compound etching is employed. As an example of good performance, GaAs etching with the smooth surface and the anisotropic, profile has been demonstrated. Preliminary work on "in-process" AES and SIMS has confirmed that the advanced studies about the etching kinetics can be expected by using the etching system shown here.

SUMMARY OF THE INVENTION

It is, therefore, an object of the present invention to provide a plasma processing apparatus having a large-diameter plasma source capable of minimizing a reflected wave and solving problems resulting from the reflected wave.

It is another object of the present invention to provide a plasma processing apparatus capable of detecting reflected power without a power monitor and automatically tuning a microwave.

It is still another object of the present invention to provide a plasma processing apparatus capable of minimizing a reflected wave of a microwave, regardless of whether the microwave is a pulse wave or a continuous wave, so as to increase a plasma generation efficiency, and to provide a plasma processing apparatus in which a continuous wave can be used and therefore a sample is not damaged or particles do not adhere on the sample.

It is still another object of the present invention to provide a plasma processing apparatus capable of performing etching or CVD on the entire surface of an object to be processed.

It is still another object of the present invention to provide a plasma processing apparatus in which a film can be formed with high uniformity and film formation can be easily controlled.

It is still another object of the present invention to provide a plasma processing apparatus in which a microwave tuning function having a wide tuning range is additionally provided to minimize a reflected wave, thereby effectively utilizing microwave power.

That is, the present invention is a plasma processing apparatus in which a microwave is radiated on a reaction gas supplied into a plasma generating chamber to generate plasma, and predetermined processing is performed for an object placed in the reaction chamber for plasma processings, wherein the plasma generating chamber opposed to the reaction chamber has a first side face which is entirely open and faces a plane in which the object is placed, and a second side face which is located opposite to the first side face and from which the microwave is supplied, and wherein the distance between the first and second side faces is set to be an integer multiple of a ½ wavelength of the microwave.

In the above apparatus, a magnetic field is applied to a vacuum vessel, and a microwave in a direction perpendicular to the direction of the magnetic field is oscillated from a microwave oscillator to act on the magnetic field through a waveguide, thereby generating a plasma in the plasma generating chamber by an electron cyclotron resonance phenomenon.

In the present invention, a current flowing through a susceptor on which the object to be processed is mounted may be detected, and a tuner located between a microwave supply system and a plasma generating system may be tuned to maximize the susceptor current.

In this case, the present invention comprises a tuner located in a microwave transmission path between a microwave generating unit and the vaccum vessel, a current detecting means for applying a bias voltage to a susceptor of the vacuum vessel and detecting a current flowing through the susceptor, and a control means for tuning the tuner to maximize the detected susceptor current, and it is preferable to automatically match the vacuum vessel with the microwave transmission path.

In addition, in the present invention, a wavelength adjusting means for a microwave may be connected to the waveguide immediately before the discharge chamber.

Also, in the present invention, the microwave oscillator may be connected to the vacuum vessel through a tapered waveguide.

Furthermore, in the present invention, the reaction chamber may comprise a reaction gas supply tube having at least two gas injection tubes for injecting a reaction gas to different portions, the gas injection tubes being partially located near an installation position of the object to be processed.

Moreover, in the present invention, a resonance adjusting means for varying and adjusting a transmission path length of a microwave to set a resonant state may be installed to a microwave transmitting means for transmitting a microwave generated by a microwave generating source to the plasma generating chamber.

BRIEF DESCRIPTION OF THE DRAWINGS

FIG. 9 is a block diagram showing a controller and a tuner driver shown in FIG. 5;

FIG. 10 is a flow chart for explaining an operation of a one-chip CPU shown in FIG. 9;

FIG. 11 is a perspective view showing an outer appearance of a tuner;

FIG. 12 is schematic view showing a plasma processing apparatus according to Embodiment 3;

FIG. 13 is a graph showing data of microwave power and a reflected wave obtained when Embodiment 3 is used;

FIG. 14 is a graph showing data of magnetic field generation conditions and a reflected wave obtained when Embodiment 3 is used;

FIG. 17 is a perspective view showing a rectangular waveguide and a tapered waveguide in Embodiment 4;

FIG. 18 is a schematic view showing an electric field distribution of a microwave in the tapered waveguide;

FIG. 19 is a sectional view showing still another embodiment different from Embodiment 4;

DETAILED DESCRIPTION OF THE PREFERRED EMBODIMENTS

Embodiment 1

An embodiment of the present invention will be described below with reference to the accompanying drawings.

Figure 1:
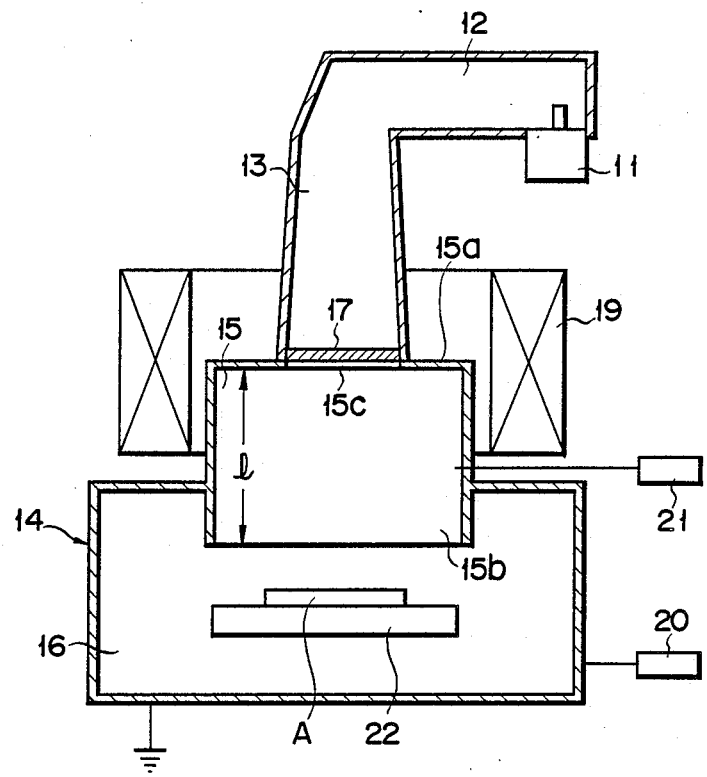
FIG. 1 is a schematic view showing an arrangement of a plasma processing apparatus according to Embodiment 1.

FIG. 1 is a schematic view showing an overall plasma processing apparatus. Microwave oscillator 11 is connected to plasma generating chamber 15 of vacuum vessel 14 through rectangular waveguide 12 and tapered waveguide 13. Vessel 14 is obtained by coaxially, integrally forming cylindrical plasma generating chamber 15 and cylindrical reaction chamber 16 having a larger diameter than that of generating chamber 15. Generating chamber 15 is connected to reaction chamber 16 so that its side walls are located inside chamber 16. Generating chamber 15 is a cylindrical member having an area three to five times that of a large-diameter opening end of waveguide 13. For example, if the opening diameter of waveguide 13 is 110 mm, the diameter of vessel 14 is about 200 to 250 mm. Connection hole 15c having crystal plate 17 is formed in the central portion of end portion (waveguide connection end) 15a of generating chamber 15 to be connected to waveguide 13. A portion other than the central portion is closed by a wall. The end face of end portion (reaction chamber connection end) 15b of generating chamber 15 connected to reaction chamber 16 is entirely opened. An axial length of generating chamber 15, i.e., length l between waveguide connection end 15a and reaction chamber connection end 15b is set to be an integer multiple of a ½ wavelength of a microwave. Therefore, the microwave can be easily and efficiently reflected and converted into a plasma energy. For this reason, the microwave is converted into a plasma at a high ratio and rarely remains as a useless reflected wave.

Magnetic field coil 19 surrounds generating chamber 15 of vessel 14. Exhaust pump 20 and gas supply unit 21 are connected to vessel 14. Susceptor 22 is located in reaction chamber 16 of vessel 14.

Assume that etching or CVD is performed on semiconductor wafer A using the plasma processing apparatus having the above arrangement. Wafer A is placed in reaction chamber 16 of vessel 14 and held by susceptor 22. Entire vessel 14 is evacuated by pump 20 to about $10^{-7}$ Torr, and a processing gas such as $SF_6$ gas is supplied from supply unit 21 to vessel 14 at a pressure of about $10^{-4}$ to $10^{-2}$ Torr. A current is flowed through coil 19 to generate a magnetic field of 875 to 1,200 Gauss about the direction of a coil axis in generating chamber 15 of vessel 14. Oscillator 11 applies a microwave having a frequency, for example 2.45 GHz which satisfies electron cyclotron conditions to chamber 15 of vessel 14 through waveguides 12 and 13. In this case, the microwave is generated by oscillator as the pulses having a frequency of 50 to 200 Hz. This microwave as the pulses can generate a stable plasma in a wide range. Upon an interaction of the microwave and the magnetic field, an electron cyclotron resonance phenomenon occurs in chamber 15. As a result, a highly-dissociated plasma is generated. More specifically, the microwave is partially absorbed by rotating electrons to be directly converted into a plasma energy. The plasma generated in generating chamber 15 is supplied from entirely opened connection end 15b of chamber 15 to reaction chamber 16 and acts on wafer A placed in chamber 16 to perform etching or CVD.

In this plasma processing apparatus, almost no reflected wave is generated. Therefore, generation of the microwave is not adversely affected by a reflected wave returned to oscillator 11 through waveguides 12 and 13. Unlike in a conventional apparatus, no isolator need be connected to a waveguide to consume a reflected wave. Therefore, a plasma can be uniformly generated without disturbing the electric field of the microwave, thereby uniformly processing wafer A.

A description will be made with reference to cases wherein a continuous microwave and a pulse microwave are used for generating a plasma.

Figure 2:
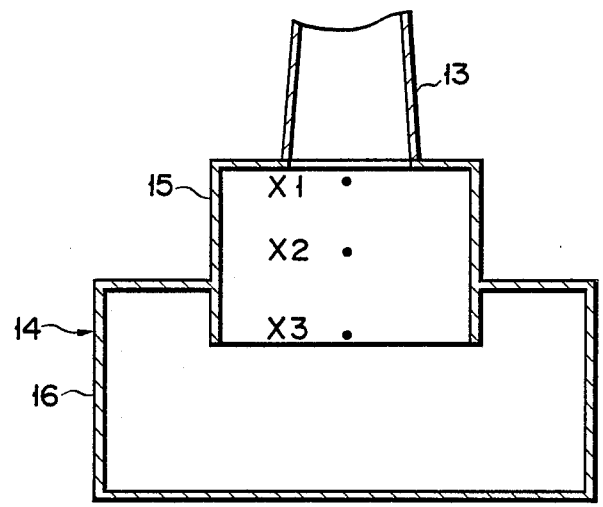
FIG. 2 is a schematic view showing positions in a vacuum vessel at which a magnetic field of 875 Gauss is generated.
Figure 3:
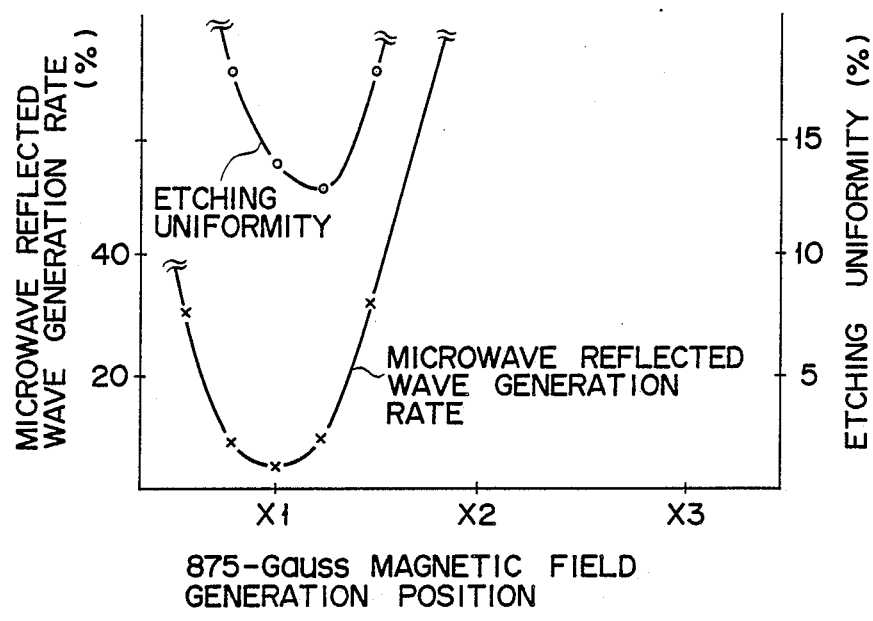
FIGS. 3 and 4 are graphs showing a relationship between the 875-Gauss magnetic field generation positions in the vacuum vessel, a reflected wave generation rate and etching uniformity.
Figure 4:
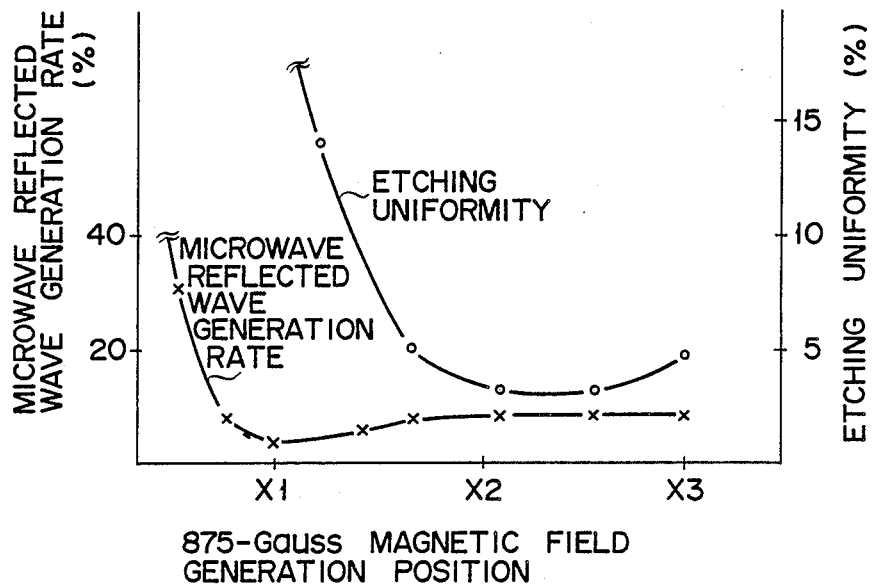

FIG. 2 shows positions $X_1$, $X_2$ and $X_3$ at which a magnetic field of 875 Gauss is generated in the longitudinal direction of generating chamber 15. FIGS. 3 and 4 show a reflected wave of a microwave and etching uniformity of a wafer.

FIG. 3 shows a reflected wave generation rate and etching uniformity obtained when a continuous microwave is used at each position at which an 875-Gauss magnetic flux is generated in the longitudinal direction of chamber 15. The graph shows the reflected wave generation rate and the etching uniformity at 875-Gauss magnetic flux generation point $X_1$ and those at positions before and after point $X_1$. The reflected wave generation rate and the etching uniformity, however, are poor at points $X_2$ and $X_3$. For this reason, values obtained at points $X_2$ and $X_3$ fall outside the range of the graph shown in FIG. 3 and are therefore not shown in FIG. 3. When the continuous microwave is used, as shown in FIG. 3, the electric field is intense when the 875-Gauss magnetic field is generated at point $X_1$ because the microwave is not spread in chamber 15. Therefore, the microwave can be efficiently converted into a plasma by an interaction of the electric field and the magnetic field, and a reflected wave is less generated. In this state, however, since an intense plasma is generated in a narrow range, an etching rate of wafer A is higher at the central portion of the wafer, resulting in poor etching uniformity. When the 875-Gauss magnetic field is generated at points $X_2$ and $X_3$, the electric field of the microwave is wide and weak. Therefore, the microwave cannot be efficiently converted into a plasma. For this reason, a reflected wave of the microwave is increased, and plasma generation becomes unstable. Also, the etching uniformity is further degraded. Therefore, when the continuous microwave is used, wafer A cannot be uniformly etched.

FIG. 4 shows the reflected wave generation rate and the etching uniformity obtained at each 875-Gauss generation point in the overall longitudinal direction of chamber 15 when a pulse microwave is used. As is apparent from FIG. 4, the reflected wave generation rate and the etching uniformity are good throughout the axial length of chamber 15.

When the pulse microwave is used, a peak value of the microwave electric field is large as shown in FIG. 4. For this reason, regardless of which of points $X_1$, $X_2$ and $X_3$ is the site of the 875-Gauss magnetic field generation, the microwave is efficiently converted into a plasma and a reflected wave is less generated. In addition, when a magnetic field of 875 Gauss is generated at points $X_2$ and $X_3$ at which the microwave electric field is sufficiently spread, the etching uniformity is largely improved.

The area of chamber 15 of vessel 14 is three times that of the waveguide and connection portion 15b of chamber 15 is entirely opened. For this reason, a large-diameter plasma can act on wafer A. The area of chamber 15 need not be three to five times that of waveguide 13 but may be more than that. That is, the larger the area is, the less the reflected wave is generated.

When no gas is present in vessel 14, many reflected waves of a microwave are sometimes generated to destroy the microwave oscillator. Therefore, a microwave oscillator having a rated output much higher than an operation output is used. For example, for the sake of safety, a microwave oscillator having a rated output of 1,500 W is used, and a maximum operation output is limited to 500 W.

Embodiment 2

Figure 5:
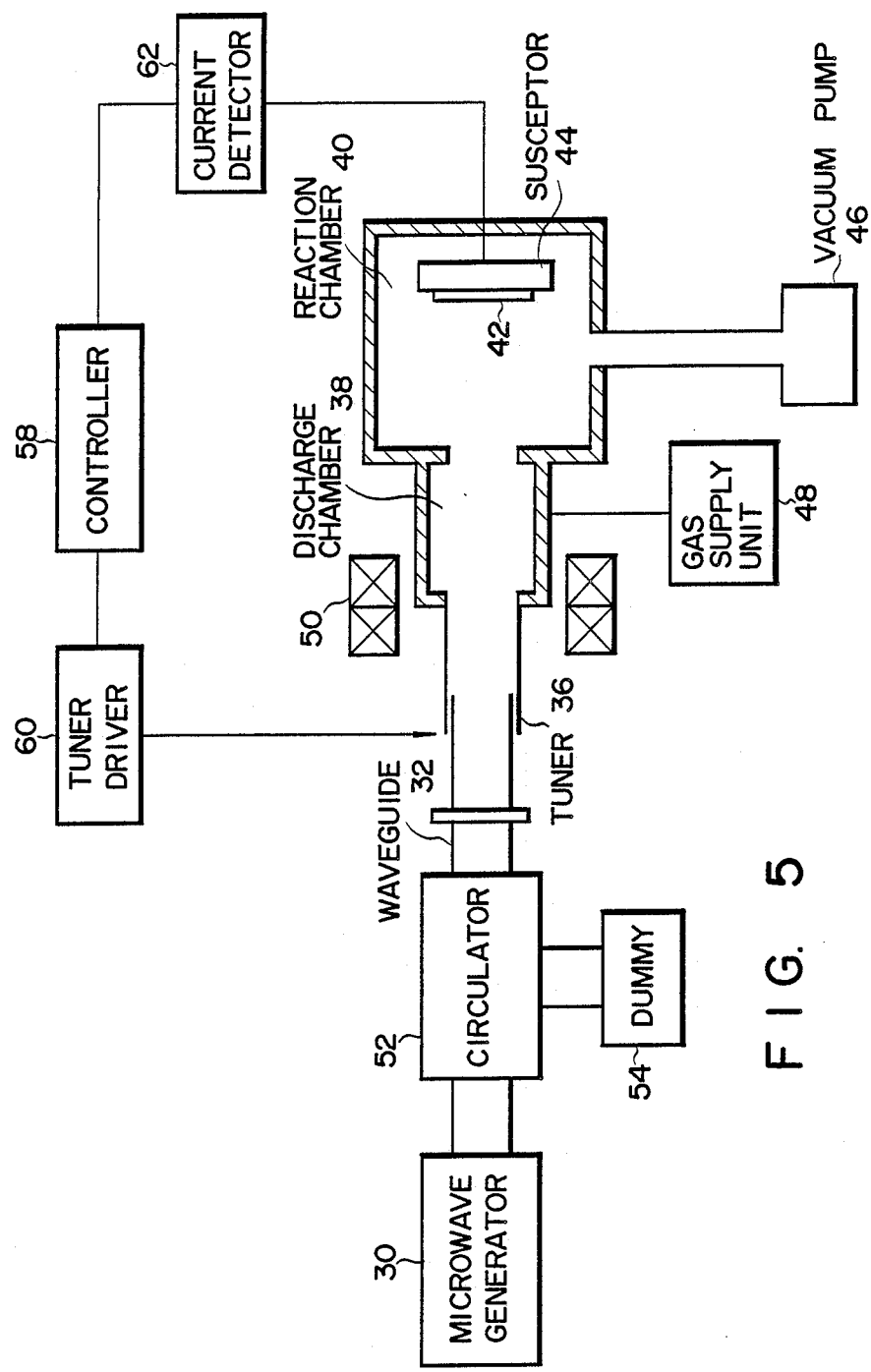
FIG. 5 is a schematic view showing a plasma processing apparatus according to Embodiment 2.

Another embodiment of the present invention will be described below. Preferable examples of a plasma processing apparatus and its tuning unit will be described below with reference to FIG. 5. In FIG. 5, the same reference numerals as in the conventional apparatus shown in FIG. 3 denote the corresponding parts and a detailed description thereof will be omitted.

In a plasma processing apparatus according to this embodiment, an output from microwave generator 30 is supplied to discharge chamber 38 through waveguide 32 and tuner 36, thereby generating a plasma in discharge chamber 38 and reaction chamber 40.

Figure 6:
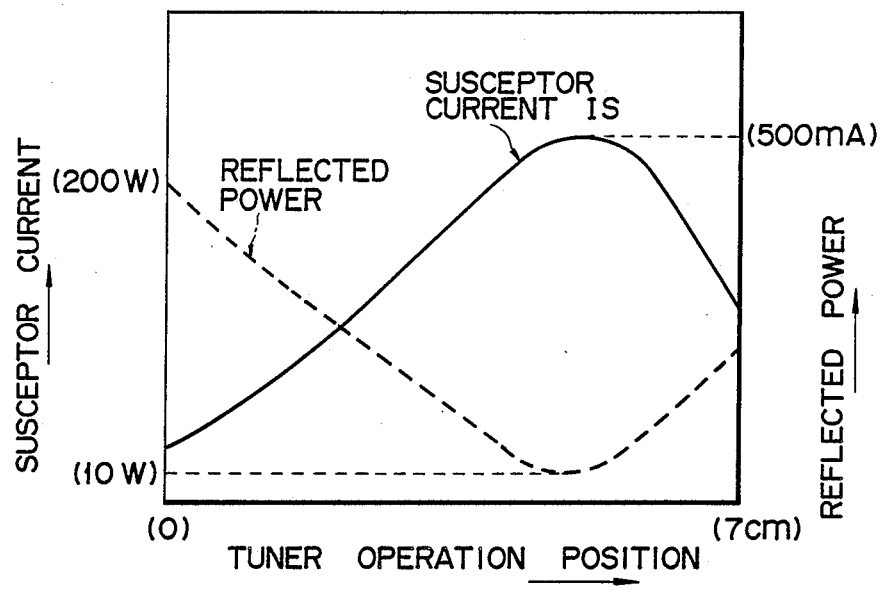
FIG. 6 is graph showing a relationship between a current flowing through a susceptor of the apparatus shown in FIG. 5 and a reflected power.

By applying a negative bias voltage to susceptor 44 to generate a plasma, susceptor current is and reflected power of a microwave were measured. FIG. 6 shows a measurement result. At this time, measurement of the reflected power was performed using a conventional apparatus given of the results shown in FIG. 3.

As is apparent from the measurement result, current Is and the microwave reflected power have a predetermined correlation. That is, when the microwave reflected power is minimized, effective microwave power to be supplied to chambers 38 and 40 is maximized. This is because current Is flowing through susceptor 44 is maximized by ions or electrons generated by the plasma.

By measuring current (Is), therefore, the reflected power from chamber 38 can be indirectly detected.

For this reason, in this embodiment, current detector 62 applies a negative bias voltage to susceptor 44 and current detector 62 is connected to susceptor 44.

Controller 58 calculates a tuning signal on the basis of detected susceptor current Is so that current Is is maximized and outputs the signal to tuner driver 60.

Driver 60 tunes tuner 36 on the basis of the tuning signal and adjusts the length of waveguide 32 so that waveguide 32 matches with discharge chamber 38.

In this manner, according to the plasma processing apparatus of this embodiment, tuner 36 can be automatically tuned on the basis of current (Is) flowing through susceptor 44. For this reason, as compared with a conventional technique using power monitor 34 and display unit 56, tuning control can be performed very simply.

Figure 7:
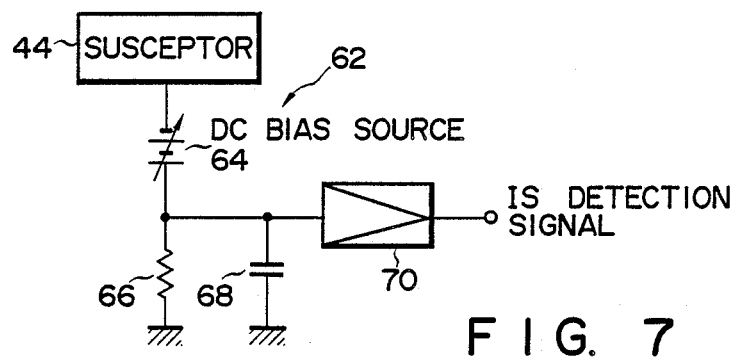
FIGS. 7 and 8 are circuit diagrams showing a current detector shown in FIG. 5.

As shown in FIG. 7, detector 62 of above-mentioned embodiment comprises DC bias source 64, resistor 66, capacitor 68 and amplifier 70. A negative bias voltage is applied to susceptor 44 by bias source 64, and a current flowing through susceptor 44 is detected through amplifier 70.

Figure 8:
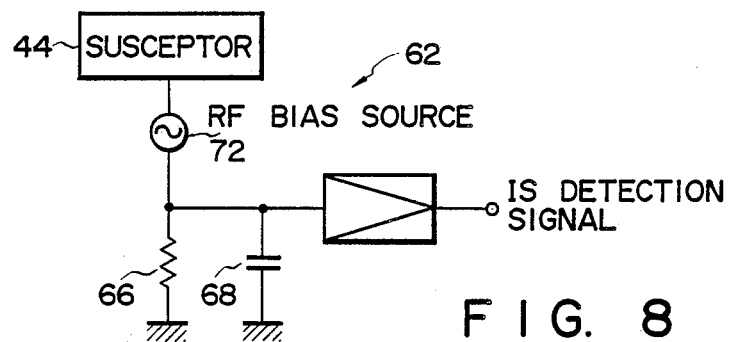

As current detector 62, RF bias source 72 may be used in place of DC bias source 64 as shown in FIG. 8.

As shown in FIG. 9, controller 58 of above-mentioned embodiment comprises a one-chip CPU. Current Is output from detector 62 is supplied to the one-chip CPU. Also, a one-way movement end limit signal and a +— direction movement end limit signal are supplied from limit switches 74a and 74b located at tuner 36 to the CPU.

Figure 16:
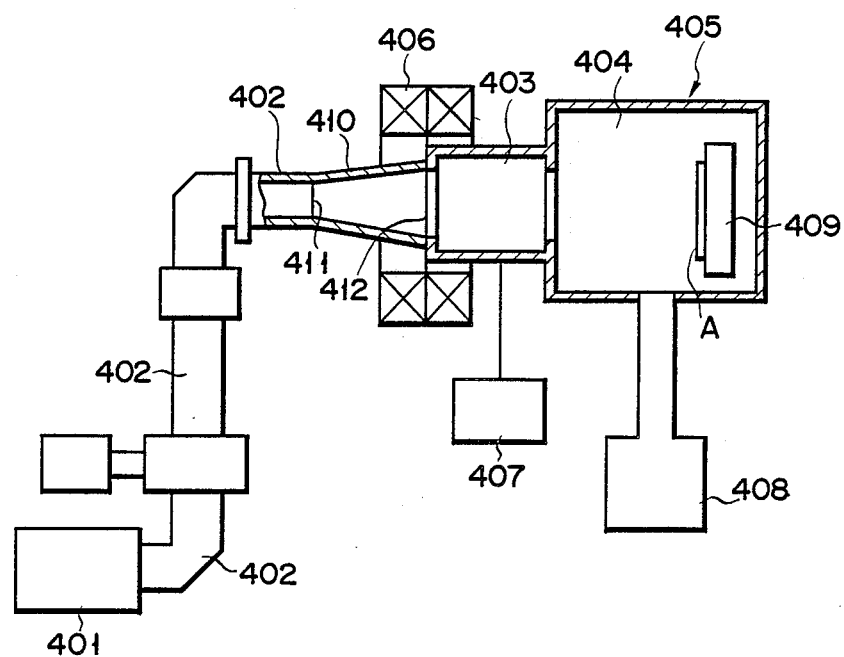
FIG. 16 is a schematic view showing a plasma processing apparatus according to Embodiment 4.

Driver 60 of this embodiment comprises motor driver 80, motor 82 and drive mechanism 84, as shown in FIG. 16, and can adjust the length of tuner 36.

The one-chip CPU constituting controller 58 which is mentioned above, performs calculations in accordance with a flow chart shown in FIG. 17.

That is, controller 58 reads current detected by detector 62 at each predetermined time interval, e.g., five seconds in this case and calculates change amount In.

If change amount ΔIn of the detected current is predetermined allowable error ΔI or less, controller 58 determines that detected current (Is) is close to the maximum value and stops automatically tuner 36 at the position.

If change amount ΔIn of the detected current exceeds range ΔI, controller 58 checks whether amount In is positive or negative. If controller 58 determines that change amount ΔIn is a positive value, it increases the length of tuner 34 so that the value of Is is maximized. If controller 58 determines that change amount ΔIn is negative, it decreases the length of tuner 16 so that the value of (Is) is similarly maximized.

Controller 48 repeatedly performs the above operation at an interval of five seconds.

Therefore, even if the wavelength of a microwave changes, the length of tuner 36 is automatically controlled to match waveguide 32 with discharge chamber 38, thereby minimizing reflected power from chamber 38.

In this embodiment, tuner 36 and drive mechanism 84 constitute a tuning mechanism shown in FIG. 11. This tuning mechanism comprises fixed waveguide 90, movable waveguide 92, fixed waveguide bracket 94, movable waveguide bracket 96, motor 82, pulleys 100 and 102, drive belts 104a and 104b, drive ball screw 106, slide bearing 08 and slide shaft 110.

In this tuning mechanism, when susceptor current Is changes, motor 82 is driven on the basis of a drive command output from one-chip CPU 58.

A rotational output from motor 82 is transmitted to belts 104a and 104b and then to pulleys 102 and 100.

Screw 106 is directly connected to pulley 100. Rotation of motor 82 is therefore transmitted to screws 106 to move bracket 86, thereby automatically moving waveguide 92 to a position at which current Is is maximized.

In order to receive the weight of waveguide 92, shaft 110 is fixed to bracket 94 to serve as a shaft of bearing 108 fixed to bracket 96.

Such a tuning mechanism is satisfactory as long as it can automatically vary and adjust the length of waveguide 92 using a motor, an air cylinder or another drive source to perform tuning. Therefore, in place of the ball screw, a driving means such as a rack and a pinion may be used.

In this embodiment, tuner 36 is of a type which changes the length of a waveguide. The present invention, however, is not limited to this embodiment, but a tuner of another type, e.g., a stub tuner or an EH tuner may be used. Also, two or more tuners of any of the above type may be used in a combination.

In this embodiment, controller 58 comprises a one-chip CPU. The present invention, however, is not limited to this embodiment, but a circuit arrangement of the controller may be of either an analog or digital type.

Furthermore, in this embodiment, controller 58 adjusts the position of tuner 36 in accordance with the flow shown in FIG. 10. The present invention, however, is not limited to this embodiment, but another adjusting method may be used if necessary. For example, a variable range of tuner 36 may be entirely scanned to detect a position at which susceptor current Is is minimized so that the position of tuner 36 is adjusted to this position.

According to the plasma processing apparatus of this embodiment, reflected power of a microwave is detected on the basis of a susceptor current. For this reason, the microwave power monitor and the like used in the conventional apparatus shown in FIG. 3 need not be used. Therefore, tuning control of the tuner can be performed using a compact and inexpensive device.

Embodiment 3

A plasma processing apparatus according to still another embodiment of the present invention will be described below with reference to FIG. 12. In FIG. 12, reference numeral 201 denotes a microwave source for generating a microwave. This plasma processing apparatus comprises microwave source 201, waveguides 202 to 205 for transmitting a microwave, discharge chamber 206 for generating a plasma and reaction chamber 207 for performing deposition on a sample by the generated plasma. Small coil 208 surrounds discharge chamber 206 to generate a magnetic field. Microwave source 201 is a microwave generating unit such as a magnetron for generating a microwave of, e.g., an industrial frequency (2.45 GHz).

Waveguides 202 to 205 are metal tubes made of stainless steel or the like. Power monitor 203a is connected to waveguide 203 to measure incident power and reflected power of a generated microwave and monitor a reflected wave. Waveguide 204 is an E corner for changing a transmission path of the microwave through a right angle. Waveguide 205 is a tapered waveguide in which dielectric plate 209 is inserted perpendicularly to a propagation direction of the microwave.

By the shape of waveguide 205 and the presence of dielectric plate 209, the microwave propagating through plate 209 is converted from a TE10 mode into a quasi-TM mode. A crystal plate can be used as plate 209.

Waveguide 205 is located immediately before and connected to discharge chamber 206. Three stubs 210 as a wavelength adjusting means for a microwave are connected to waveguide 205. That is, waveguide 205 performs mode conversion of the microwave and adjustment of the wavelength.

Member 211 is inserted between waveguide 205 and chamber 206 to pass the microwave and seal a vacuum in chamber 206. Similar to dielectric plate 209, a crystal plate is suited as member 211.

Chamber 206 is designed to serve as a microwave resonating chamber. Chamber 206 therefore has a length corresponding to one wavelength in a vacuum of the microwave in an electric field direction and has microwave reflecting plate 212 at its one end. Opening portion 212a is formed in plate 212 to supply a plasma generated in discharge chamber 206 to reaction chamber 207. The diameter of opening portion 212a may be 60 to 80 mm as in the conventional apparatus. More preferably, the diameter is set to be about 100 to 120 mm. The value may be changed in accordance with the diameter of a sample such as a wafer to be processed.

The size of coil 208 surrounding chamber 206 is set so as not to interfere with an operation of three stubs 210 of waveguide 205. Coil 208 is preferably a small coil having a cooling unit inside the coil, e.g., a tube coil in which cooling water is circulated in a tube to improve a cooling efficiency.

Coil 208 generates a magnetic field perpendicular to an electric field. The intensity of the magnetic field is set such that, for example, magnetic flux density B=875 Gauss with respect to a microwave of 2.45 GH2.

Chamber 206 has inlet port 213 for supplying a gas such as $N_2$, $O_2$ or Ar serving as a plasma source.

Reaction chamber 207 utilizes the plasma generated in discharge chamber 206 to perform CVD on sample W such as a wafer substrate and includes sample table 214. Sample W is conveyed to and placed on table 214 by a convey mechanism (not shown). In order to perform deposition in chamber 207, $SiH_4$ or the like is supplied from gas inlet port 215. In this case, if a generated plasma is an $N_2$ plasma, $Si_3N_4$ is deposited on the sample by an interaction of the $N_2$ plasma and $SiH_4$. If an $O_2$ plasma is generated, $SiO_2$ is deposited.

Chambers 206 and 207 are connected to a vacuum system (not shown), and deposition is performed at a desired pressure (reduced pressure) in accordance with a purpose.

An operation of the plasma processing apparatus having the above arrangement will be described below.

First, microwave source 201 generates a continuous microwave. Alternately, microwave source 201 can also generate a pulse of microwave. The microwave is supplied to waveguide 105 through waveguides 202 to 204, Converted from the TE$_{10}$ mode into a circular TE$_{11}$ mode therein, and transmitted to discharge chamber 206. A gas serving as a plasma source is supplied from gas inlet port 215 to chamber 206. A desired magnetic field is generated chamber 206 by small coil 208. Therefore, the transmitted microwave resonates in chamber 206 and an electric field energy is absorbed with high efficiency, thereby generating a highly active plasma. Upon supply of the gas, an impedance of chamber 206 changes and its length no longer corresponds to the wavelength of the microwave. This change, however, is detected as an increase in a reflected wave by power monitor 203a. Therefore, the wavelength of the microwave is adjusted by the three stubs of waveguide 205 to obtain matching. Three stubs 210 are located at waveguide 205 immediately before chamber 206 in which the microwave resonates. For this reason, even a continuous wave can be matched with a good response characteristic.

The generated plasma flows as a plasma stream from opening portion 212a of reflecting plate 212 to reaction chamber 207. In chamber 207, the plasma collides against sample W on sample table 214 by an interaction with a supplied reaction gas to perform deposition. At this time, a bias voltage is applied to table 214 if necessary, so that an under film portion is flattened and side wall portions are rendered dense.

Since opening portion 212a is wide, the plasma stream is uniform throughout a wide range from its center, and deposition can be therefore uniformly performed.

FIG. 13 shows data of power and a reflected wave obtained by the apparatus of this embodiment when a continuous wave is used. FIG. 14 shows data of a reflected wave obtained when a generation position of 875 Gauss as an ECR condition is changed by changing a coil current. As is apparent from FIGS. 13 and 14, when the microwave power was 400 W or more, the percentage of a reflected wave was stably very small at about .1%. In addition, regardless of the magnetic field generation position, the percentage of the reflected wave was very small at about 1%. When the type or pressure of the discharge gas was changed, the same result was obtained.

In this embodiment, a tapered waveguide is used immediately before chamber 206, and dielectric plate 209 is inserted therein. The present invention, however, is not limited to this embodiment. For example, even if the mode of the microwave is not converted or the waveguide is a circular tube, the reflected wave can be effectively minimized.

Figure 15:
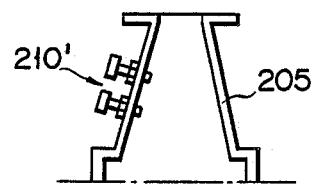
FIG. 15 is a schematic view showing still another embodiment different from Embodiment 3.

In addition, an adjusting means for microwave matching is not limited to the three stubs but may be a waveguide with two stubs 210' shown in FIG. 15 or the like.

According to such a plasma CVD apparatus, since matching of a microwave is performed immediately before the discharge chamber, matching can be performed with a good response characteristic, and a reflected wave of the microwave can be minimized. The diameter of a plasma stream can be increased accordingly. For this reason, etching or deposition can be uniformly performed to manufacture a high-quality product. Especially when the apparatus is used in combination with a tapered waveguide, the percentage of the reflected wave can be decreased to 1% or less.

Furthermore, if a continuous wave of microwave is generated as a output, a plasma is not intermittently generated as when a pulse wave is used. Therefore, particles are not generated nor adhere on a sample, or a sample is not damaged by a high self bias.

Moreover, the adjusting means of the microwave is located at the waveguide immediately before the discharge chamber. For this reason, since a three-stub tuner need not be used as in the conventional apparatus, the overall apparatus can be made compact.

Embodiment 4

Still another embodiment of the present invention will be described below. FIG. 16 is a schematic view showing an arrangement of a plasma processing apparatus according to this embodiment. In FIG. 16, the same reference numerals as in FIG. 6 denote the same parts, and a detailed description thereof will be omitted. In this plasma processing apparatus, tapered waveguide 410 is inserted between rectangular waveguide 402 and generating chamber 403 of vacuum vessel 405. As shown in FIG. 17, one end opening of waveguide 410 is formed into a rectangle having a size corresponding to a rectangular section of waveguide 402, and the other end thereof is formed into a circle having a size corresponding to a circular section of chamber 403. Waveguide 410 is tapered such that a rectangular section is gradually deformed into a circular section from rectangular opening 411 to circular opening 412, thereby gradually increasing a sectional area. Rectangular opening 411 of tapered waveguide 410 is connected to a rectangular opening at the end portion of rectangular waveguide 402. Circular opening 412 is connected to a circular opening of generating chamber 403.

In the plasma processing apparatus having the above arrangement, a microwave oscillated by oscillator 401 propagates through waveguide 402 and then waveguide 410. In waveguide 410, a sectional shape of an electric field of the microwave is gradually deformed from a rectangle to a shape close to a circle in accordance with the tapered shape of waveguide 410. Also, a sectional area of the electric field is gradually increased. FIG. 18 shows the shape of the electric field of the microwave finally obtained at circular opening 412 as an outlet of waveguide 410. In this manner, the shape of the electric field of the microwave is converted into a shape close to a circle, and the microwave is supplied into circular generating chamber 403. For this reason, chamber 403 can generate a plasma having an electric field the shape of which is substantially similar to that of the electric field formed at the outlet of waveguide 410, i.e., an electric field close to a circle and having a large sectional area. This plasma can act on the entire surface of circular wafer A placed on susceptor 409 in reaction chamber 404. Therefore, etching or CVD can be uniformly performed on the entire surface of wafer A. As a result, a problem in that an unprocessed portion partially remains can be prevented.

FIG. 19 shows still another embodiment. In this embodiment, tapered waveguide 410 and plasma generating chamber 403 are integrally formed. Chamber 403 has height h and diameter d determined by a vacuum vessel design size. Chamber 403 has therein internal vessel 414 made of a material such as a crystal capable of maintaining a vacuum and transmitting a microwave and having a size close to the size of chamber 403. Vessel 414 is used to uniformly apply a plasma to a wafer. In this embodiment, etching or CVD can be uniformly performed by the presence of vessel 414.

As described above, according to this plasma processing apparatus, a plasma can act on the entire surface of a semiconductor wafer to uniformly perform etching or CVD thereon.

Embodiment 5

Figure 20:
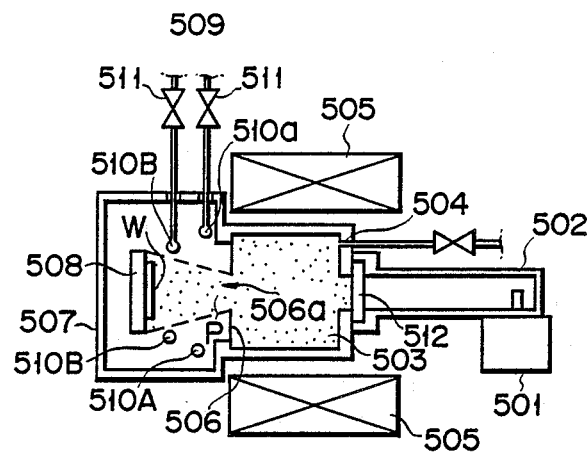
FIG. 20 is a schematic view showing a plasma processing apparatus according to Embodiment 5.

A plasma processing apparatus according to still another embodiment of the present invention will be described below with reference to FIG. 20. This plasma processing apparatus comprises, as a plasma generating system for generating a plasma, microwave source 501, waveguide 502, discharge chamber 503 and coil 505. Chamber 503 is connected to film formation chamber 507 as a reaction chamber for CVD film formation.

Microwave source 501 is a device such as a magnetron for generating a microwave of, e.g., an industrial frequency (2.45 GHz). Waveguide 502 is a metal tube for transmitting the generated microwave and, if necessary, includes a wavelength adjusting means, a mode conversion means and a reflected wave monitor unit for the microwave. Gas supply tube 504 is connected to chamber 503 and supplies a gas such as $N_2$, $O_2$ or Ar serving as a plasma source selected in accordance with the type of a film to be formed. The gas is supplied at a predetermined flow rate.

A magnetic field in an electric field direction is generated in chamber 503 by coil 505. The intensity of the magnetic field satisfying ECR conditions is, e.g., 875 Gauss with respect to a microwave of 2.45 GHz. By this magnetic field and the microwave, an electric field energy can be efficiently absorbed by charged particles, thereby generating a highly active plasma. The frequency of the microwave and the intensity of the magnetic field may be arbitrarily selected as long as the above effect is achieved.

Discharge chamber 503 and film formation chamber 507 are connected to a vacuum system (not shown) and maintained at a predetermined pressure. For this reason, sealing member 512 is inserted between waveguide 502 and chamber 503 to seal a vacuum and transmit the microwave.

Chamber 503 includes microwave reflecting plate 506 located at its end portion connected to film formation chamber 507 so that the microwave resonates in chamber 503. A plasma stream is supplied from opening portion 506a of plate 506 to chamber 507.

Chamber 507 includes sample table 508, and a convey mechanism (not shown) conveys sample W onto table 508. Two inlet ports 509 are formed in chamber 507 to supply a reaction gas for film formation, and ring-like gas injection tubes 510A and 510B are connected to ports 509.

Figure 21:
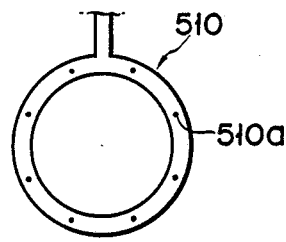
FIGS. 21 and 22 are schematic views showing reaction gas injection tubes.

As shown in FIG. 21, each of tubes 510A and 510B consists of ring tube 510 made of a crystal and having a plurality of gas injection holes 510a. The diameter of tube 510A is larger than that of tube 510B. Tube 510A is separated from sample W and plasma stream P, while tube 510B is located near the periphery of sample W so as to be in contact with plasma stream P.

A reaction gas of the same type is supplied to tubes 510A and 510B from a gas supply system (not shown). Examples of the reaction gas are silane gas ($SiH_4$), boron and phosphorus and sometimes supplied as a gas mixture with argon (Ar) or $N_2$ gas. A flow rate of the reaction gas or a mixing ratio of the gas mixture is controlled in accordance with film formation conditions. In order to obtain uniformity of film formation, these parameters are controlled by tubes 510A and 510B. For this purpose, the gas supply system includes valves 511 which are automatically controlled, and film formation uniformity is measured beforehand under predetermined film formation conditions. In actual film formation, therefore, both the valves can be controlled to obtain an optimal value on the basis of the measurement result.

An operation of the ECR plasma CVD apparatus having the above arrangement will be described.

First, when the ECR conditions are satisfied in discharge chamber 503 by the microwave supplied from microwave source 501 and the magnetic field generated by coil 505, a plasma of the gas supplied from supply tube 504 is generated and flowed as plasma stream P to film formation chamber 507. In chamber 507, the reaction gas is injected from gas injection tubes 510A and 510B and diffused throughout the chamber. The reaction gas reacts with the supplied plasma to deposit a reaction product film on the surface of a sample. In this case, a film formation rate is in proportion to the plasma intensity and higher at the central portion of the sample. The reaction gas, however, is also supplied to the vicinity of the sample from tube 510B located near the plasma and the sample. Therefore deposition is promoted at the periphery of sample W. As a result, a reaction product film is uniformly formed on the sample surface. In this case, the flow rate of the reaction gas supplied from tubes 510A and 510B' can be adjusted by automatically controlling valves 511 in accordance with film formation conditions.

When CVD was performed on a silicon wafer using the apparatus of this embodiment, film formation uniformity of ±3% was obtained for a wafer of 150 mm.

Figure 22:
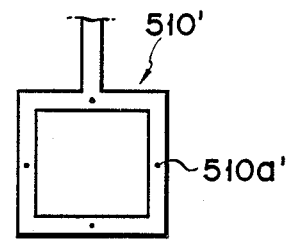

In the above embodiment, two large and small ring-like gas injection tubes 510A and 510B are used as a gas injection tube. However, the number, the size and the shape of the gas injection tubes are not limited to those of the above embodiment. For example, the gas injection tube separated from the plasma need not be a ring but may be a straight tube or the like. Also, the gas injection tube located near the sample need not be a circular ring but may be square-ring gas injection tube 510' as shown in FIG. 22 or comprise a plurality of straight tubes. That is, the gas injection tube located near the sample may take any shape as long as it can supply the reaction gas to the vicinities of the sample and the plasma or in the plasma stream.

Figure 23:
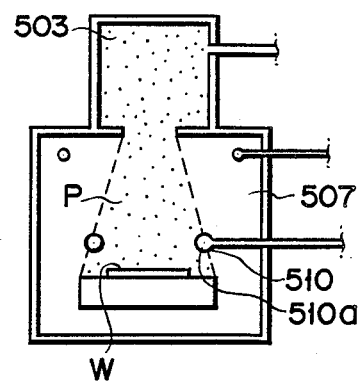
FIG. 23 is a schematic view showing a plasma processing apparatus according to still another embodiment different from Embodiment 5.

In order to increase the film formation rate at the periphery of the sample, ring-like gas injection tube 510 having gas injection holes 510a opposing the periphery of sample W may be located near sample W and n plasma stream P, as shown in FIG. 23.

As described above, according to the plasma processing apparatus of this embodiment, by changing the reaction gas supply position in the film formation chamber, the film formation uniformity can be significantly improved. In particular, a superior effect can be achieved for a large-diameter wafer.

Embodiment 6

Figure 24:
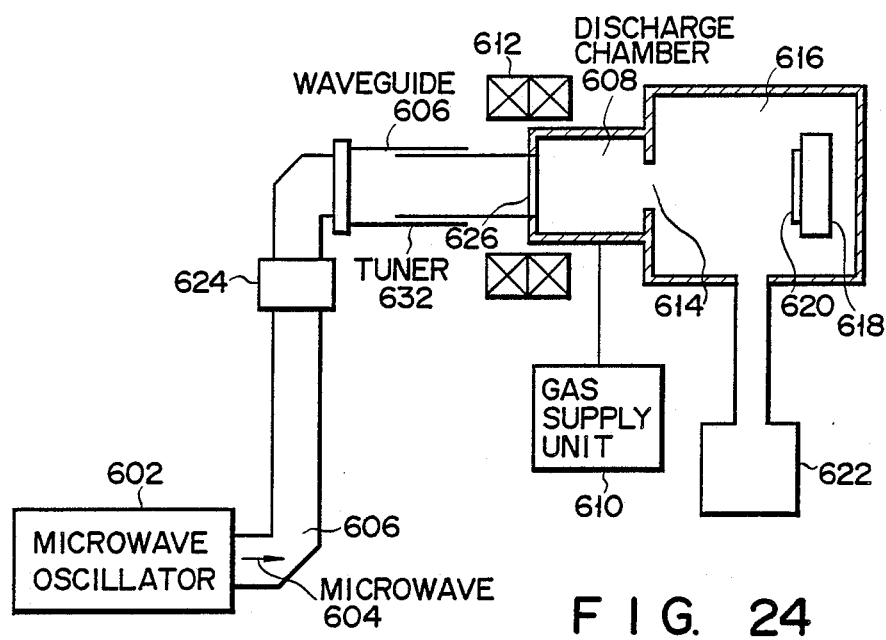
FIG. 24 is a schematic view showing a plasma processing apparatus according to Embodiment 6.

A plasma processing apparatus according to still another embodiment of the present invention will be described with reference to FIG. 24.

In the plasma processing apparatus, waveguide 606 serves as a microwave transmitting means for transmitting microwave 604 generated by microwave oscillator 602 serving as a microwave generating source to discharge chamber 608 serving as a plasma generating chamber, and tuner 632 is connected to waveguide 606 to serve as a resonance adjusting means for varying the length of a transmission path of microwave 604 to obtain a resonant state.

Tuner 632 has a double-pipe structure at a position connected to waveguide 606, thereby adjusting the transmission path length.

In this case, microwave 604 passing through tuner 632 is supplied to discharge chamber 608 through crystal 626.

With this arrangement, in a vacuum or plasma state, the length of tuner 632 can be changed in correspondence with a change in permittivity of chamber 608 and in accordance with a change ratio of the wavelength of microwave 604 in chamber 608. As a result, microwave 604 from tuner 632 can be matched with chamber 608, thereby realizing a nonreflecting state.

With such adjustment, i.e., by changing the length of tuner 632, tuner 632 can correspond to the change from the vacuum to plasma state in chamber 608.

Figure 25:
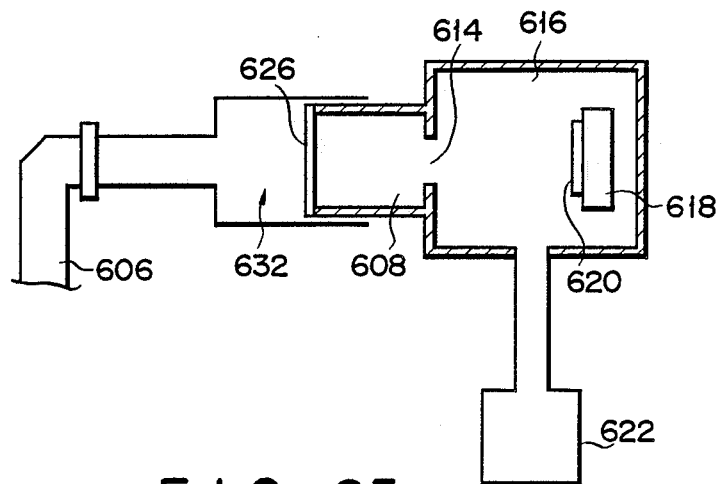
FIG. 25 is a schematic view showing a plasma processing apparatus according to still another embodiment different from the plasma processing apparatus of Embodiment 6.

Tuner 632 may comprise a cavity resonator connected to both waveguide 606 and discharge chamber 608 so as to be freely expanded/contracted, as shown in FIG. 25. Also in this case, the same effect can be obtained.

Furthermore, the plasma processing apparatus of the present invention can be effectively used in combination with a widely-used microwave tuner such as a 603 stub tuner.

In this plasma processing apparatus, tuning can be performed in a wide resonance range to minimize a reflected wave. Therefore, since microwave power can be effectively utilized, a microwave oscillator of a minimum necessary output can be used.

In addition, a cost of the apparatus can be decreased. Also, since almost no reflected wave is generated, a circulator or load need not be used. As a result, the apparatus can be made compact at low cost.

What is claimed is:

1. A plasma processing apparatus in which a microwave is radiated on a reaction gas supplied into a plasma generating chamber to generate plasma, and predetermined processing is performed for an object placed in the reaction chamber for plasma processings, wherein the plasma generating chamber opposed to the reaction chamber is provided with an electrical ground connection at the outer periphery thereof and which has a first side face which is entirely open and faces a plane in which the object is placed, and a second side face which is located opposite to the first side face and from which the microwave is supplied, and wherein the distance between the first and second side faces is set to be an integer multiple of a ¼ wavelength of the microwave.

2. An apparatus according to claim 1, wherein a current flowing through a susceptor on which said object to be processed is mounted is detected, and a tuner located between a microwave supply system and a plasma generating system is tuned to maximize the susceptor current.

3. An apparatus according to claim 1, wherein said reaction chamber comprises a reaction gas supply tube having at least two gas injection tubes for injecting a reaction gas to different portions, said gas injection tubes being partially located near a mounting position of said object to be processed.

4. An apparatus according to claim 1, wherein resonance adjusting means for varying and adjusting a transmission path length of a microwave to set a resonant state is incorporated in microwave transmitting means for transmitting a microwave generated by a microwave generating chamber source to said plasma generating chamber.

5. An apparatus according to claim 1, wherein a distance between the first and second side faces is an integer multiple of ½ the wavelength of the microwave.

6. An apparatus as in claim 1 further comprising:

a wavelength adjusting means connected to a waveguide immediately before a discharge chamber for adjusting a microwave to a predetermined wavelength.

7. An apparatus according to claim 5, further comprising:
   a tuner located in a microwave transmission path between a microwave generating unit and a vacuum vessel;
   current detecting means for applying a bias voltage to a susceptor of said vacuum vessel and detecting a current flowing through said susceptor; and
   control means for tuning said tuner to maximize the detected susceptor current,
   wherein said vacuum vessel is automatically matched with said microwave transmission path.

8. An apparatus according to claim 7, wherein said microwave generating unit is connected to said vacuum vessel through a tapered waveguide.

* * * * *